United States Patent [19]
Gupta et al.

[11] Patent Number: 5,910,453
[45] Date of Patent: Jun. 8, 1999

[54] DEEP UV ANTI-REFLECTION COATING ETCH

[75] Inventors: Subhash Gupta; Mutya Vicente, both of San Jose, Calif.

[73] Assignee: Advanced Micro Devices, Inc., Sunnyvale, Calif.

[21] Appl. No.: 08/584,941

[22] Filed: Jan. 16, 1996

[51] Int. Cl.$^6$ .................................................. H01L 21/302
[52] U.S. Cl. .......................... 438/717; 438/725; 438/724; 438/736; 216/47
[58] Field of Search .......................... 156/659.11, 661.11; 216/47, 49, 50, 67; 438/725, 724, 717, 736, 744

[56] References Cited

U.S. PATENT DOCUMENTS

| | | | |
|---|---|---|---|
| 4,624,909 | 11/1986 | Saotome et al. | 430/192 |
| 4,751,170 | 6/1988 | Mimura et al. | 430/296 |
| 4,968,582 | 11/1990 | Tranjan et al. | 430/270 |

FOREIGN PATENT DOCUMENTS

| | | |
|---|---|---|
| 01024244 | 1/1989 | Japan . |
| 01215024 | 8/1989 | Japan . |
| 02076225 | 3/1990 | Japan . |

OTHER PUBLICATIONS

"DUV Lithography For 0.35–$\mu$m CMOS Processing"; Van Driessche et. al.; 1995; Microelectronics Eng., 27(1–4), pp. 243–245.

*Primary Examiner*—Benjamin Utech
*Assistant Examiner*—George Goudreau
*Attorney, Agent, or Firm*—Sawyer & Associates

[57] ABSTRACT

An etching process for DUV photolithography is provided for etching a layer of anti-reflection coating (ARC) comprising spin-on organic ARC material which is formed beneath a layer of photoresist. After patterning the layer of photoresist, the layer of ARC is etched by employing a mixture of oxygen plasma, nitrogen plasma, and at least one inert gas. Anisotropic etching of the layer of ARC is provided with the process of the present invention. In comparison with prior art etching processes for etching a layer of ARC, the process of the present invention provides a favorable etch rate with improved selectivity over the etching of the layer of photoresist. The layer of ARC is etched without causing lateral erosion of the layer of photoresist. Faceting of the top edges of the corners of the layer of photoresist is also minimized. The profile of the layer of photoresist is essentially maintained thereby enabling for critical dimension fidelity. The process of the present invention is residue-free, and provides favorable selectivity for etching the layer of ARC over most underlying materials conventionally used in integrated circuit structures. The layer of ARC can also be etched by employing a mixture of nitrogen plasma and inert gas. Employing a mixture of nitrogen plasma and inert gas, without oxygen plasma, provides a reduced etch rate.

18 Claims, 1 Drawing Sheet

DEEP UV ANTI-REFLECTION COATING ETCH

TECHNICAL FIELD

The present invention relates generally to deep ultraviolet (DUV) photolithography employed in semiconductor processing, and, more particularly, to etching a DUV antireflection coating formed beneath a layer of photoresist which is formed over a semiconductor substrate.

BACKGROUND ART

Photolithography is conventionally employed in the fabrication of integrated circuits on semiconductor substrates to pattern the semiconductor substrate or metal, semiconductor, or dielectric layers formed thereon.

Photolithography involves the formation of an optical image on a layer of photosensitive material, i.e., photoresist, which is formed over an underlying material to be patterned. The optical image corresponds to the pattern to be transferred to the underlying material. Ultra-violet (UV) light is conventionally employed to form the optical image on the layer of photoresist. The optical image comprises bright regions where UV light is incident on the layer of photoresist and dark regions where no UV light is incident on the layer of photoresist. Accordingly, some portions of the photoresist are exposed to light. Other portions of the photoresist remain unexposed.

After being exposed, the layer of photoresist is developed to form a patterned layer of photoresist having a shape which is delineated by the optical image. The patterned layer of photoresist is employed as a mask to facilitate the transfer of the pattern to the underlying material.

Conventional semiconductor fabrication processes typically employ g-line photolithography, i-line photolithography, or DUV photolithography which utilize UV light having wavelengths of 0.436, 0.365, or 0.280 micrometers, respectively. The minimum size of a feature that can be formed in the underlying material, i.e., the minimum feature size, depends on the photolithography process employed. In particular, the minimum feature size is physically limited by the wavelength of light used to create the optical image. Short wavelength light provides a higher resolution optical image than long wavelength light. Accordingly, DUV photolithography provides higher resolution than i-line photolithography or g-line photolithography.

As device geometry gets smaller ($\leq 0.35$ micrometers), the resolution provided by conventional i-line and g-line photolithography becomes inadequate to achieve minimum feature size requirements. Thus, for patterning small geometries less than about 0.35 micrometers, DUV photolithography is required.

Conventional novelac resin-based resists are typically employed for i-line and g-line photolithography. However, conventional novelac resin-based resists cannot be employed with DUV photolithography. Rather, DUV photoresist, typically comprising polysulfone-based material, is conventionally employed. This DUV photoresist is substantially transparent to DUV light. DUV light which passes through the DUV photoresist, however, will be reflected and scattered from topographical structures formed in the underlying material. In general, the underlying material is particularly reflective to DUV light.

The enhanced reflectivities in the DUV region, however, adversely impact the patterning of the underlying material to be patterned. DUV light incident on the layer of photoresist that is reflected and scattered causes unintended exposure of the layer of photoresist. This unintended exposure of the layer of photoresist leads to reflective notching. Reflections from adjacent areas produce unwanted exposure of the DUV photoresist and trigger a chemical reaction which will make the DUV photoresist soluble in aqueous media. For small feature sizes, the unintended exposure changes the critical dimension.

In order to minimize the effects of unintended exposure of the layer of photoresist due to reflected DUV light, a layer of anti-reflective coating (ARC) is required between the layer of photoresist and the underlying material to be patterned. The layer of ARC typically consists of spin-on organic material. This spin-on organic material comprises organic long-chain or polymeric compounds. In particular, for DUV photolithography, a polyimide-like ARC material is conventionally employed as a layer of ARC. Generally, these organic polymeric compounds comprising polyimide-like material contain a substantial number of aromatic rings in the polymeric compound for increased absorption of DUV light.

The layer of ARC is typically thin in comparison with the layer of photoresist. The thickness of the layer of ARC is approximately 1000 Å.

The layer of ARC also acts as a barrier layer to prevent chemical poisoning of the layer of photoresist by the underlying material. The DUV photoresist comprises organic material, such as polysulfone-based material. Conventional DUV photoresists, like polysulfone-based resists, are particularly sensitive toward several materials commonly used in the semiconductor industry. In particular, metals, silicon nitrides (SiN), metal nitrides (e.g., TiN), silicides or salicides (e.g., TiS and WSi), as well as doped oxides or doped glasses (e.g., boron-phosphorus doped silicate glass) can poison the DUV photoresist unless a layer of barrier material is provided for protection. APEX resist, available from Shipley Company (Marboro, Mass.) is an example of a typical polysulfone-based DUV photoresist. APEX resist is sensitive toward materials commonly used in the semiconductor industry.

To pattern the underlying material once the layer of photoresist has been developed, the exposed ARC material has to be etched away. Removing the layer of ARC will expose the surface of the underlying material. The layer of ARC can be removed ex situ or in situ. The layer of ARC is preferably removed in situ.

Etching processes such as reactive ion etching or other ion-assisted etch processes employing high density plasma are typically used to remove the layer of ARC. A mixture comprising oxygen and halocarbons, such as freons, is conventionally employed. This mixture may also include Ar.

Using a mixture consisting of oxygen and halocarbons to etch the exposed ARC material, however, adversely affects the photoresist profile. In particular, the photoresist profile is eroded or altered, thereby changing the critical dimensions. Also, when oxygen and halocarbons are employed, the DUV photoresist, which comprises polysulfone-based material, is etched at a faster rate than the layer of ARC.

Additionally, employing a mixture comprising oxygen and halocarbons to etch the layer of ARC often leaves behind residues. Etching with halocarbons tends to result in the formation of polymers. These polymers may be deposited on the sidewalls of the photoresist or on the surface of the underlying material to be patterned. The deposition of these polymers on the sidewalls of the photoresist can cause CD variation. The residues left on the surface of the underlying material impede etching thereof. This effect, whereby residues left on the surface of the underlying material impede etching, is conventionally known as micromasking.

The addition of oxygen can reduce the formation of these polymers. High $O_2$ concentrations, however, can produce severe erosion of the photoresist and consequently large variation in CD. Accordingly, an appropriate concentration of oxygen must be employed which provides a balance between the advantageous tendency of oxygen to reduce the formation of residues with the disadvantageous tendency of oxygen to erode the photoresist.

Alternatively, pure oxygen or oxygen mixed with Ar can be used to etch the exposed ARC material. Etching processes employing pure oxygen or oxygen mixed with Ar are residue-free. By residue-free is meant that after removal of the layer of ARC, no residues are left on the surface of the underlying material to be patterned. Employing pure oxygen or oxygen mixed with Ar to etch the ARC material, however, causes substantial erosion of the layer of photoresist.

As described above, both DUV photoresist and the layer of ARC comprise organic materials. For DUV photolithography, the layer of ARC typically comprises a polyimide-like material and the layer of photoresist typically comprises a polysulfone-based resist. Since the DUV photoresist and the layer of ARC are both organic polymers, highly selective removal of the layer of ARC by plasma etching techniques is not possible. For example, employing pure oxygen or oxygen mixed with Ar in the etching process causes organic material to be removed from both the layer of ARC and the DUV photoresist. In fact, a layer of photoresist comprising polysulfone-based photoresists etches at a higher rate than the layer of ARC comprising polyimide-like material.

Additionally, the critical dimension of the photoresist mask, i.e., the layer of patterned photoresist, is altered by lateral erosion. This lateral erosion is caused by the isotropic etching of the patterned photoresist by the oxygen. Argon bombardment, also, causes substantial faceting of the top corners of the features in layer of photoresist. This faceting ultimately can cause degradation of the photoresist profile.

An etching process which employs nitrogen, a non-reactive gas, mixed with inert gases (e.g., helium, neon, and argon, etc.) for etching ARC material, is the subject of a separately-filed patent application, Ser. No. 08/359,232, filed on Dec. 19, 1994, by Subhash Gupta et al, entitled "Selective i-line BARL Etch Process" [B-056]. This etching process is specifically designed for i-line photolithography applications wherein an organic i-line photoresist material and an organic i-line bottom anti-reflection layer (BARL) material are employed to pattern an underlying layer. The total carbon and oxygen content is different in the organic i-line photoresist material and the organic i-line BARL material. In particular, the organic i-line BARL material has a higher concentration of oxygen atoms than the organic i-line photoresist material. As such, the organic i-line BARL material can be made more polarized than the organic i-line photoresist material. The polarizability affinity of organic i-line BARL coating material originates from the anhydride functional groups in the moiety. The etching process disclosed in the above-mentioned patent application which employs nitrogen mixed with inert gases to etch the organic i-line BARL material makes use of the polarizability affinity of organic i-line BARL material to selectively etch the organic i-line BARL material at a higher rate than the organic i-line photoresist material. An etching selectivity of organic i-line BARL to organic i-line photoresist of 1.6 is achieved.

Thus, there remains a need for an etching process for DUV photolithography which etches the layer of ARC with minimal erosion or alteration of the photoresist mask, and which is residue-free, thereby avoiding micromasking.

DISCLOSURE OF INVENTION

In accordance with the invention, a process is provided for transferring a pattern formed in a layer of photoresist to layer of an organic polymeric compound formed over a semiconductor substrate. The process comprises the steps of:

(a) forming the layer of organic polymeric compound over the semiconductor substrate, the layer of organic polymeric compound having a surface;

(b) forming a layer of photoresist on the layer of organic polymeric compound;

(c) patterning the layer of photoresist thereby exposing the surface of the layer of organic polymeric compound, wherein the patterning involves exposing the layer of photoresist to light and subsequently developing the layer of photoresist; and (d) removing the layer of organic polymeric compound which is exposed by etching the exposed layer of organic polymeric compound with a mixture of oxygen plasma, nitrogen plasma, and at least one inert gas.

The process of the present invention may be employed to etch a layer of organic polymeric compound which is used as an anti-reflection coating. Alternatively, the process of the present invention may be employed to etch a layer of organic polymeric compound which is employed as a barrier to protect the layer of photoresist from poisoning by an underlying material formed beneath the layer of organic polymeric compound.

The process of the present invention enables the removal of the layer of ARC (or, more generally, the layer of organic polymeric compound) which is exposed after patterning the layer of photoresist. Anisotropic etching of the layer of ARC is provided with the process of the present invention. In comparison with prior art etching processes, the process of the present invention provides improved selectivity for etching the layer of ARC with respect to the layer of photoresist. With the process of the present invention, the layer of ARC is etched without causing lateral erosion of the layer of photoresist. The process of the present invention also causes minimal faceting of the top corners of the layer of photoresist. The profile of the photoresist is essentially maintained during the etching of the layer of ARC. Accordingly, the critical dimensions are effectively unchanged. The process of the present invention is also residue-free.

Advantageously, the process of the present invention is compatible with almost all metals or metal alloys, semiconductor and dielectric material conventionally employed in the fabrication of integrated circuits. By compatible is meant that the etching process of the present invention will selectively etch the layer of organic polymeric compound without etching the underlying material which typically comprises inorganic material. That the process of the present invention does not etch the underlying material is particularly important when the surface of the underlying material is non-planar.

In those instances where the surface of the underlying material is non-planar, the layer of ARC exhibits substantial local thickness variation. When the layer of ARC is spun onto the surface of the underlying material, it flows into and fills the low regions. The layer of ARC is thus thicker in the low regions than in high regions of the topography. As such, the layer of ARC formed over the high regions of the underlying material will be completely removed before the ARC material is completely removed from the low regions.

Advantageously, the process of the present invention does not etch the underlying material. Accordingly, when the layer of ARC is completely removed from the high regions, the underlying material does not get attacked with the continuation of etching which is required to removed the ARC material from the low regions where the layer of ARC is thicker.

In a separate embodiment of the present invention, a process is provided for employing deep ultra-violet photolithography to transfer a pattern formed in a layer of photoresist comprising deep ultra-violet photoresist to a layer of anti-reflection coating formed over a semiconductor substrate. The layer of anti-reflection coating (ARC) comprises an organic polymeric compound. In this embodiment of the invention, a nitrogen plasma mixed with inert gas, in the absence of oxygen, is employed to etch the layer of organic polymeric compound.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

Figure 1:
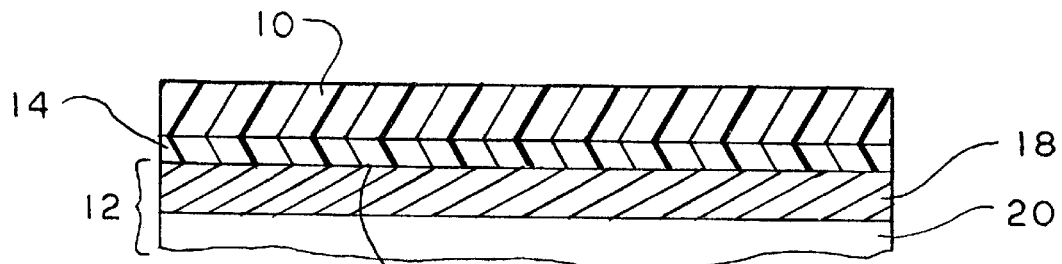
FIG. 1 is a cross-sectional view depicting a layer of photoresist formed on a layer of ARC which is formed over a semiconductor substrate.

Referring now to FIG. 1 wherein like reference numerals designate like elements throughout, a layer of photoresist 10 formed over an integrated circuit structure 12 is depicted. A layer of ARC 14 separates the layer of photoresist 10 from the integrated circuit structure 12. The layer of ARC 14 comprises an organic polymeric compound. The layer of organic polymeric compound or layer of ARC 14 is formed on the surface 16 of an underlying material 18 which is to be patterned.

As shown in FIG. 1, the underlying material 18 is a single layer formed on the semiconductor substrate 20. The integrated circuit structure 12 comprises the semiconductor substrate 20 having formed thereon the underlying material 18.

Alternatively, one or more layers of material may separate the underlying material 18 to be patterned and the semiconductor substrate 20. In the case where one or more layers of material separate the underlying material 18 and the semiconductor substrate 20, the integrated circuit structure 12 comprises the semiconductor substrate 20 having formed thereon the one or more layers of material which have formed thereon the underlying material to be patterned.

Additionally, the integrated circuit structure 12 upon which the layer of photoresist 10 is formed, may comprise the semiconductor substrate 20 alone. In this case, the underlying material 18 is semiconductor material which comprises the semiconductor substrate 20.

DUV photolithography is employed to pattern the underlying material 18 formed on the semiconductor substrate 20. Other suitable photolithographic techniques may also be employed in the practice of the present invention. Such processing is conventional and forms no part of this invention.

The DUV photolithography process involves exposing the layer of photoresist 10 to DUV radiation. The layer of photoresist 10 comprises DUV photoresist. APEX resist, a polysulfone-based DUV photoresist, is an example of a DUV photoresist that may be employed. Other suitable photoresist materials may also be employed in the process of the present invention.

As described above, in order to minimize the effects (e.g., reflective notching) of unintended exposure of the layer of photoresist 10 due to reflected UV light, the layer of ARC 14 is required between the layer of photoresist 10 and the underlying material 18 to be patterned. This layer of ARC 14 is typically thin in comparison with the layer of photoresist 10. The thickness of the layer of ARC 14 is approximately 1000 Å. The layer of ARC 14 also acts as a barrier layer toward chemical poisoning of the layer of photoresist 10 by the underlying material 18.

A spin-on organic material comprising an organic polymeric compound is employed as ARC material, as is conventional. In particular, a polyimide-like ARC material is used as the layer of ARC 14 as is conventional for DUV lithography. Other suitable organic polymeric compounds may also be employed in the process of the present invention.

(In cases where only large features are being patterned, the layer of ARC 14 may not be required. Nevertheless, a layer of organic material which may be similar in composition to ARC material, i.e., comprising organic polymeric compounds, may be employed as a barrier to protect the DUV photoresist from poisoning by the underlying material 18. The process of the present invention is also applicable to etching a layer of organic polymeric compound 14 employed as a barrier to protect the DUV photoresist.)

Figure 2:
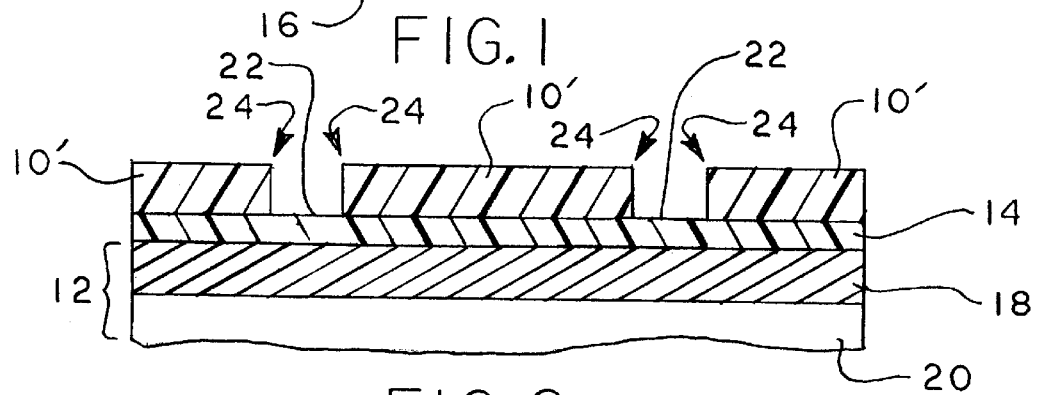
FIG. 2 is a cross-sectional view depicting the layer of photoresist after being exposed and developed to form a pattern therein which exposes the layer of ARC.

After being exposed, the layer of photoresist 10 is developed to form a pattern therein. As described above, such processing is conventional and forms no part of this invention. A patterned layer of photoresist 10' which exposes the surface 22 of the layer of ARC 14 is thereby formed as shown in FIG. 2. The patterned layer of photoresist 10' depicted in FIG. 2 is employed as a mask to facilitate the transfer of the pattern, to the underlying material 18.

To pattern the underlying material 18, however, the exposed layer of ARC 14 has to be removed to expose the surface 16 of the underlying material. This layer of ARC 14 can be removed ex situ or in situ. The layer of ARC 14 is preferably removed in situ.

The process of the present invention is directed to removing the exposed layer of ARC 14, thereby exposing the surface 16 of the underlying material. A magnetically-enhanced reactive ion etch (MERIE) system is employed to remove the layer of ARC 14. The MERIE system provides a plasma of ions to etch the exposed layer of ARC 14. A magnetic field within the MERIE system provides a means for directing charged particles, i.e., ions, to the surface to be etched, i.e., the surface 22 of the layer of ARC 14. Additionally, the magnetic field enhances the ion density and hence the etch rate. Other suitable means of providing high density plasma may also be employed in the process of the present invention.

In accordance with the present invention, a plasma etchant is introduced into the MERIE system to etch the layer of ARC 14. The plasma etchant includes an oxygen plasma, preferably produced from $O_2$.

Oxygen plasma is an effective and efficient method for etching organic polymeric compounds. By an oxygen plasma is meant a plasma comprising oxygen species, such as $O_2^+$ and $O^+$, derived from a source of oxygen, such as $O_2$, NO, $N_2O$, $NO_2$, CO, and $CO_2$. Preferably, the source of the oxygen plasma is molecular oxygen, $O_2$, and the discussion below, by referring to "$O_2$ plasma" is directed to this embodiment.

A relatively large abundance of $O_2^+$ species and $O^+$ species are present in $O_2$ plasma. The $O_2^+$ species and the $O^+$ species are directed by the MERIE system toward the surface 22 of the layer of ARC 14. Both the $O_2^+$ species and the $O^+$ species will contribute toward reactive ion etch. The $O_2^+$ species, however, is likely to dissociate at the reaction site, i.e., the surface 22 of the layer of ARC 14 which is exposed. The $O_2^+$ reacts with carbon from the organic polymeric compound, giving rise to atomic oxygen. Atomic oxygen, being neutral, is not directed by the magnetic field toward the surface 22 of the layer of ARC 14. Atomic oxygen will, however, etch the layer of ARC 14. The lack of directionality of the atomic oxygen will cause isotropic etching. Lateral erosion of the layer of ARC 14 due to the isotropic nature of the etch in the oxygen plasma results. Additionally, the layer of photoresist 10 is eroded as well. In $O_2$ plasma, the photoresist material is eroded faster than the ARC material. The DUV photoresist, such as APEX and other polysulfone-based resists, is particularly susceptible to erosion. The critical dimensions are difficult to control because of the lateral erosions of the layer of photoresist 10 and the layer of ARC 14.

To minimize the effect of atomic oxygen near the reaction site, scavenger atoms are provided in the process of the present invention. The scavenger atoms comprise free radicals which are capable of sweeping and/or capturing the undesirable species which in this case is the atomic oxygen. The scavenger atoms must sweep and/or capture atomic oxygen without significantly hindering the etch rates of the layer of ARC 14. Selection of the scavenger atoms must be such that the presence thereof does not suppress the reaction of $O^+$ or $O_2^+$ with the spin-on organic material comprising organic polymeric compound. Additionally, the scavenger atoms should preferably capture the atomic oxygen present near the reaction site before the oxygen atom has the opportunity to isotropically etch the layer of ARC 14 or layer of photoresist 10, causing damage thereto. Preferably, the scavenger atoms are provided by including a nitrogen plasma in the plasma etchant. Also preferably, the nitrogen plasma is provided by $N_2$.

About 4 to 100 times more $N_2$ is employed than $O_2$ to generate the plasma etchant mixture. The addition of $N_2$ generates an abundance of $N_2^+$ species that facilitates the removal of the atomic oxygen. The large relative abundance of $N_2^+$ species can sweep or capture the atomic oxygen which is produced at the reaction site, i.e., the surface 22 of the layer of ARC 14 which is exposed. By providing $N_2^+$ species in the $O_2$ plasma, lateral erosion of the layer of photoresist 10 and the layer of ARC 14 is reduced. Accordingly, the profile and critical dimension of the layer of photoresist 10 remain intact.

Additionally, a significant amount of He is added to the mixture of nitrogen and oxygen. Helium is an effective heat conductor and thus helps in cooling the wafer surface. By provided adequate cooling of the wafer surface, helium minimizes thermal degradation of the layer of photoresist 10. Without helium or other inert gases, melting of the layer of photoresist 10 is a concern, and in some cases, the etching process must be periodically stopped to allow for cooling.

The helium also may act as a diluent, reducing the residence time of active oxygen species. By reducing the residence time of active oxygen species, microloading and/or reactive ion etch lag is lowered. Additionally, the helium as a diluent causes the active oxygen species to be distributed more uniformly. More uniformity in etching across the surface 22 of the exposed layer of ARC 14 is thus provided. Finally, the addition of helium improves the selectivity of the etch, i.e., the ratio of the rate of etch of the layer of ARC 14 to the rate of etch of the layer of photoresist 10 increases. Other inert gases, such as Ar and Ne, can be employed in the process of the present invention as well.

It will be appreciated that in the absence of oxygen, the $N_2$ plasma will etch the organic polymeric compound. The etch rates, however, for the $N_2$ plasma are slow compared to the etched rates of a plasma combining $N_2$ plasma and $O_2$ plasma.

In a first and preferred embodiment, a mixture of oxygen plasma, nitrogen plasma, and at least one inert gas is formed from the constituent molecular gases. Preferably, the amount of oxygen is about 1 to 10% the amount of nitrogen. The small amount of oxygen enhances the etch rates substantially while lateral erosion of the layer of photoresist 10 is minimized by the presence of $N_2$ plasma. By minimizing the lateral erosion of the photoresist material, the profile of the layer of photoresist 10 does not change except for minor faceting of the top edges of the corners 24 of the layer of photoresist. Thus, control of the critical dimension of the layer of photoresist 10 and the features to be patterned in the underlying material 18 also are not compromised.

The extent of the faceting at the top edges of the corners 24 of the layer of photoresist 10 depends on the extent of time that the layer of photoresist is exposed to the plasma etch. The faceting at the top edges of the corners 24 of the layer of photoresist 10 is cosmetic for most etches where the underlying material 18 is etched selectivity over the layer of photoresist during subsequent etching steps. If the selectivity of the etch of the underlying material 18 over the layer of photoresist 10 is poor, however, the faceting can result in a sloped photoresist profile and in changes in the critical dimensions. The faceting of layer of photoresist 10 may also cause the features patterned in the underlying material 18 to have sloped profiles.

Large amounts of $N_2$ are primarily responsible for faceting at the top edges of the corners 24 of the layer of photoresist 10. Faceting can be minimized by reducing the amount of $N_2$. In the etching process of the present invention, the $N_2$ provides free radicals in the plasma that serve as scavenger atoms for atomic oxygen. In order to reduce the $N_2$ in the etchant mixture, without compromising control of the critical dimensions, the level of atomic oxygen at the reaction site must be reduced. Alternative sources of oxygen may be employed for generating oxygen plasma. Employing alternative sources of oxygen may produce less $O_2^+$ species at the reaction site and thus reduce the level of atomic oxygen which causes isotropic etching. For example, gases such as CO can be used as an oxygen source which produces less $O_2^+$ species at the reaction site than an $O_2$ source. Accordingly, CO mixed with helium, and a smaller amount of $N_2$, may provide favorable etching characteristics with minimal faceting at the top edges of the corners 24 of the layer of photoresist 10. The toxicity of CO renders this gas a less desirable candidate.

Instead, other gases such as NO, $CO_2$, and $N_2O$ may be suitable employed in the process of the present invention. NO, $Co_2$, and $N_2O$ may also provide a source of oxygen plasma that may produce less $O_2^+$ species at the reaction site in comparison to $O_2$. Accordingly, NO, $CO_2$, and $N_2O$ mixed with helium and a smaller amount of $N_2$ than is required with $O_2$ may provide favorable etching characteristics with minimal faceting at the top edges of the corners 24 of the layer of photoresist 10. Plasma generated from vapors using liquid sources like alcohols also provide another alternative source of oxygen plasma as well. In accordance with the present invention, a source of nitrogen and inert gas must be provided with the liquid source of oxygen as well.

Figure 3:
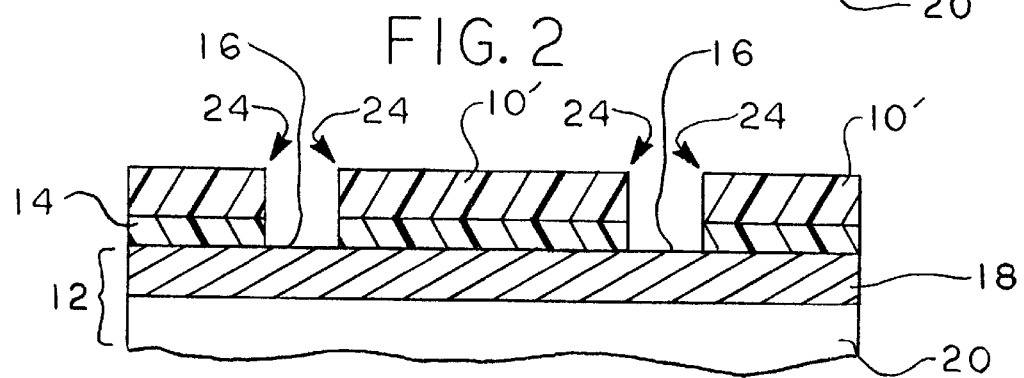
FIG. 3 is a cross-sectional view depicting the layer of ARC after etching to extend the pattern into the layer of ARC.

As described above, the mixture of $O_2$, $N_2$, and He allows the layer of ARC 14 to be removed thereby exposing the surface 16 of the underlying material 18. FIG. 3 depicts the integrated circuit structure 12 at this stage of processing.

The etching process of the present invention is compatible with most metals or metal alloys, semiconductor, and dielectric material conventionally employed in the fabrication of integrated circuits. By compatible is meant that the etching process of the present invention will selectively etch the layer of organic polymeric compound 14, without etching the underlying material 18 which typically comprises inorganic material. That the process of the present invention does not etch the underlying material 18 is particularly important when the surface 16 of the underlying material 18 is non-planar. By non-planar is meant that the surface 16 of the underlying material 18 possesses high regions and low regions.

In those instances where the surface 16 of the underlying material 18 is non-planar, the layer of ARC 14 exhibits substantial local thickness variation. When the layer of ARC 14 is spun onto the surface 16 of the underlying material 18, it flows into and fills the low regions. The layer of ARC 14 is thus thicker in the low regions than in high regions of the topography. As such, the layer of ARC 14 formed over the high regions of the underlying material 18 will be completely removed before the ARC material is completely removed from the low regions.

Advantageously, the process of the present invention does not etch the underlying material. Thus, when the layer of ARC 14 is completely removed from the high regions, the underlying material 18 does not get attacked with the continuation of etching which is required to removed the ARC material from the low regions where the layer of ARC is thicker.

The underlying material 18 is etched with an etching process suitable for removing the underlying material.

Figure 4:
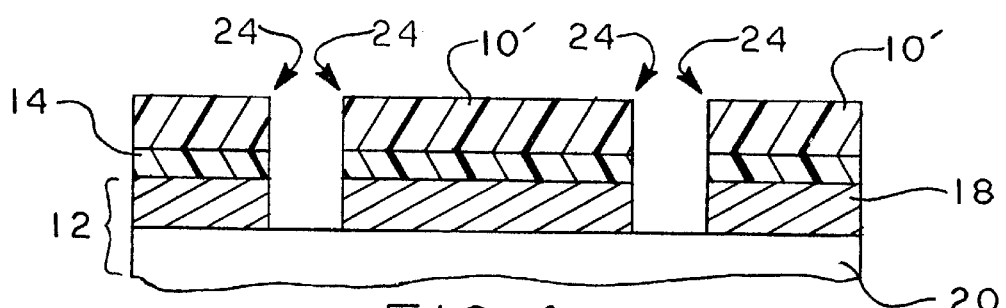
FIG. 4 is a cross-sectional view depicting the underlying material after etching to transfer the pattern into the underlying material.

Accordingly, the pattern is transferred to the underlying material 18. FIG. 4 depicts the integrated circuit structure 12 at this stage of processing.

Figure 5:
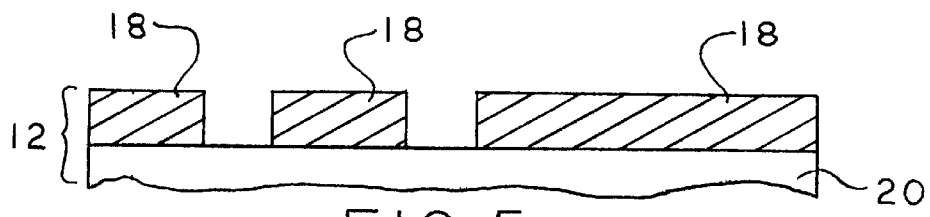
FIG. 5 is a cross-sectional view depicting the patterned underlying material after removing the remainder of the layer of photoresist and the remainder of the layer of ARC.

The remainder of the layer of photoresist 10 and the layer of ARC 14 can be removed at this stage of processing. FIG. 5 depicts the underlying material 18 patterned on the semiconductor substrate 20.

The process of the present invention enables the removal of the layer of ARC (or, more generally, the layer of an organic polymeric compound) 14 which is exposed after patterning the layer of photoresist 10. Anisotropic etching of the layer of ARC 14 is provided with the process of the present invention. In comparison with prior art etching processes, the process of the present invention provides improved selectivity for etching of the layer of ARC 14 with respect to the layer of photoresist. With the process of the present invention the layer of ARC 14 is etched without causing lateral erosion of the layer of photoresist 10. The process of the present invention also causes minimal faceting of the top edges of the corners 24 of the layer of photoresist 10. The profile of the photoresist is essentially maintained during the etching of the layer of ARC 14. Accordingly, the critical dimensions are effectively unchanged. The process of the present invention is residue-free, and as described above, is compatible with almost all metals or metal alloys, semiconductor, and dielectric material conventionally employed in the fabrication of integrated circuits.

In an alternative embodiment of the present invention, a mixture of nitrogen plasma and at least one inert gas is employed to etch the organic long-chain compound. In the absence of oxygen, the $N_2$ plasma (with or without the presence of inert gas) will etch the layer of ARC 14 with a selectivity with respect to the layer of photoresist 10 of 1. The change in critical dimensions will also be minimal. Despite the slow etch rate, employing nitrogen plasma mixed with inert gas such as helium provides a favorable means of etching the layer of ARC 14. However, changes in the physical parameters of this etching process, e.g., bias power or RF power, result in excessive faceting of the layer of photoresist 10.

EXAMPLES

Contact openings were etched in spin-on organic material comprising organic polymeric compounds via magnetically enhance reactive ion etching (MERIE) using different mixtures of oxygen, nitrogen, and helium. A layer of ARC 14 comprising the spin-on organic material was formed on several semiconductor substrates 20. A layer of photoresist 10, i.e., DUV photoresist, was formed on the layer of ARC 14. The semiconductor substrates 20 comprised silicon. The DUV photoresist was APEX-E, a polysulfone based resist available from Shipley. The ARC material was CD 11, available from Brewer Science Inc., P. O. Box GG, Rolla, Mo. 65401. The layer of photoresist 10 was exposed and developed to form a pattern therein. The layer of ARC 14 was etched to transfer the pattern from the patterned layer of photoresist 10' to the layer of ARC. Contact openings were thereby formed in the layer of ARC 14.

Example 1

In accordance with the preferred embodiment of the present invention, a mixture of oxygen, nitrogen, and helium was employed to etch the layer of ARC 14. The layer of ARC 14 was etched in a MERIE system with the following processing chemistry.

Flow rates:
    N$_2$: 50 sccm
    He: 100 sccm
    O$_2$: 5 sccm
Power Density: ~1 watt/cm$^2$
Pressure: 40 to 50 mTorr
Magnetic field: 20 gauss.

An etch rate of about 1500 Å/minute was achieved. The layer of ARC 14 was etched for 90 seconds corresponding to the removal of approximately 2200 Å of organic spin-on material. Contact holes, having a minimum feature size of 0.3 micrometers were formed. No measurable change in the critical dimension was observed. The selectivity of the etch process, in this case, the ratio of the etch of the layer of ARC 14 versus etch of the DUV photoresist, was approximately 1. The etch was also residue-free.

Accordingly, N$_2$ plasma doped with oxygen plasma provided a means for transferring the features patterned in a layer of photoresist 10 into the layer of ARC 14 without changing the critical dimension. A high flow of nitrogen provided free radicals which served as scavenger atoms for atomic oxygen produced at the reaction sites. The helium provided adequate cooling of the wafer surface to minimize thermal degradation of the layer of photoresist 10.

Example 2

A mixture of oxygen and nitrogen, without helium provided an increased etch rate. The layer of ARC 14 was etched in a MERIE system with the following processing chemistry.

Flow rates:
    N$_2$: 50 sccm
    O$_2$: 10 sccm
Power Density: ~1 watt/cm$^2$
Pressure: 40 to 50 mTorr
Magnetic field: 20 gauss.

An etch rate of greater than about 2500 Å/minute was achieved. The critical dimension inside the contact hole changed from 0.35 to 0.38 micrometers. In this example, the concentration of O$_2$ with respect to N$_2$ is higher in comparison with the example described above. Accordingly, higher O$_2$ concentrations enhance the etch rates, however, with higher O$_2$ concentrations the erosion of the layer of photoresist 10 also occur at a higher pace. This etch was also residue-free.

Adding helium helped reduce the change in critical dimension inside the contact hole. With the addition of helium (50 sccm), the critical dimension inside the contact hole changed from 0.35 to 0.364 micrometers. Helium, in this case, may act as a diluent, reducing the residence time of active oxygen species.

Example 3

In accordance with the second embodiment of the present invention a mixture of nitrogen and helium, without oxygen, was employed to etch the layer of ARC. However, the etch rate was reduced. The layer of ARC 14 was etched in a MERIE system with the following processing chemistry.

Flow rates:
    N$_2$: 50 sccm
    He: 100 sccm
Power Density: 0.8 to 1 watt/cm$^2$
Pressure: 25 to 40 mTorr
Magnetic field: 20 to 30 gauss.

The etch rate achieved was about 680 Å/minute. This etch rate is smaller than the etch rates achieved for the examples described above. However, no measurable change in the critical dimension for the contact hole was observed. Accordingly, the mixture of N$_2$ and He provides anisotropic etching with negligible lateral erosion of the photoresist sidewalls as well as negligible residue. The top edges of the corners 24 of the layer of photoresist 10, however, were faceted by the etching process.

INDUSTRIAL APPLICABILITY

The method of the invention for etching anti-reflection coatings comprising organic spin-on material is expected to find use in the semiconductor processing, in particular, in the patterning of features having sizes less than 0.35 micrometers.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Many variations of films and materials are possible. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for transferring a pattern formed in a layer of photoresist to layer of organic polymeric compound formed over a semiconductor substrate, said process comprising the steps of:

(a) forming said layer of organic polymeric compound over said semiconductor substrate, said layer of organic polymeric compound having a surface;

(b) forming a layer of photoresist on said layer of organic polymeric compound;

(c) patterning said layer of photoresist thereby exposing the surface of said layer of organic polymeric compound, wherein said patterning involves exposing said layer of photoresist to light and subsequently developing said layer of photoresist; and (d) removing said layer of organic polymeric compound which is exposed by etching said exposed layer of organic polymeric compound with a mixture of oxygen plasma, nitrogen plasma, and at least one inert gas, wherein said nitrogen plasma facilitates the removal of atomic oxygen and wherein said at least one inert gas facilitates the cooling of said layer of photoresist.

2. The process of claim 1 wherein said layer of organic polymeric compound is employed as an anti-reflection coating, wherein the anti-reflection coating is employed as a barrier to protect said layer of photoresist from a chemical reaction which otherwise would occur, said chemical reaction would be triggered by ultra-violet light reflected and scattered from an underlying material formed beneath said layer of organic polymeric compound, said chemical reaction resulting in said layer of photoresist being soluble in aqueous media.

3. The process of claim 1 wherein said layer of photoresist comprises deep ultra-violet photoresist.

4. The process of claim 3 wherein said layer of photoresist comprises polysulfone-based resist.

5. The process of claim 1 wherein said layer of organic polymeric compound comprises a substantial number of aromatic rings in said compound for absorption of deep ultra-violet light.

6. The process of claim 1 wherein of said layer of organic polymeric compound is etched in a magnetically enhanced reactive ion etching system.

7. The process of claim 1 wherein said oxygen plasma is derived from the dissociation of at least one of the oxygen-containing species selected from the group consisting of $O_2$, $CO$, $CO_2$, $NO$, and $N_2O$.

8. The process of claim 1 wherein said nitrogen plasma is derived from the dissociation of $N_2$.

9. The process of claim 1 wherein said inert gas is selected from the group consisting of He, Ne, and Ar.

10. The process of claim 1 wherein said layer of organic polymeric compound is formed on an underlying material comprising inorganic material.

11. The process of claim 10 wherein said layer of organic polymeric compound is formed on an underlying material comprising material selected from the group comprising metal, metal alloy, semiconductor, and dielectric.

12. A process for employing deep ultra-violet photolithography, a pattern formed in a layer of photoresist comprising deep ultra-violet photoresist to a layer of anti-reflection coating formed over a semiconductor substrate, said anti-reflection coating employed as a barrier to protect said layer of photoresist from a chemical reaction which otherwise would occur, where said chemical reaction would be triggered by ultra-violet light reflected and scattered from an underlying material formed beneath said layer of organic polymeric compound, where said chemical reaction would result in said layer of photoresist being soluble in aqueous media, said process comprising the steps of:

(a) forming said layer of anti-reflection coating over said semiconductor substrate, said layer of anti-reflection coating having a surface;

(b) forming a layer of photoresist on said layer of anti-reflection coating;

(c) patterning said layer of photoresist thereby exposing the surface of said layer of anti-reflection coating, wherein said patterning involves exposing said layer of photoresist to light and subsequently developing said layer of photoresist; and (d) removing said layer of anti-reflection coating which is exposed by etching said exposed layer of anti-reflection coating with a mixture of nitrogen plasma and at least one inert gas, wherein said nitrogen plasma facilitates the removal of atomic oxygen and wherein said inert gas facilitates the cooling of said layer of photoresist.

13. The process of claim 12 wherein said layer of anti-reflection coating comprises an organic polymeric compound, said organic polymeric compound having aromatic rings for absorption of deep ultra-violet light.

14. The process of claim 12 wherein said layer of photoresist comprises polysulfone-based resist.

15. The process of claim 12 wherein of said layer of anti-reflection coating is etched in a magnetically enhanced reactive ion etching system.

16. The process of claim 12 wherein said nitrogen plasma is derived from the dissociation of $N_2$.

17. The process of claim 12 wherein said inert gas is selected from the group consisting of He, Ne, and Ar.

18. The process of claim 12 wherein said layer of anti-reflection coating is formed on an underlying material comprising inorganic material.

* * * * *